United States Patent
Lin et al.

(10) Patent No.: US 9,871,198 B2
(45) Date of Patent: Jan. 16, 2018

(54) METHOD FOR MANUFACTURING A RESISTIVE RANDOM ACCESS MEMORY DEVICE

(71) Applicant: MACRONIX INTERNATIONAL CO., LTD., Hsinchu (TW)

(72) Inventors: Yu-Yu Lin, New Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/825,209

(22) Filed: Aug. 13, 2015

(65) Prior Publication Data

US 2017/0047514 A1    Feb. 16, 2017

(51) Int. Cl.
H01L 45/00    (2006.01)

(52) U.S. Cl.
CPC .......... H01L 45/1633 (2013.01); H01L 45/08 (2013.01); H01L 45/1233 (2013.01); H01L 45/146 (2013.01)

(58) Field of Classification Search
CPC . H01L 45/146; H01L 45/145; H01L 45/1683; H01L 45/1616; H01L 45/1633; H01L 45/1233; H01L 45/08
See application file for complete search history.

(56) References Cited

U.S. PATENT DOCUMENTS

| | | | |
|---|---|---|---|
| 9,099,488 B2 * | 8/2015 | Niyogi | G01N 27/002 |
| 2003/0011015 A1 * | 1/2003 | Basceri | H01L 28/75 257/310 |
| 2003/0025146 A1 * | 2/2003 | Narwankar | H01L 28/40 257/310 |
| 2003/0112380 A1 * | 6/2003 | Lee | H04N 5/64 348/836 |
| 2003/0113480 A1 * | 6/2003 | Kil | C23C 16/405 427/569 |
| 2009/0233453 A1 * | 9/2009 | Mani | H01L 21/0223 438/772 |
| 2010/0167462 A1 * | 7/2010 | Lee | H01L 45/04 438/104 |
| 2010/0167463 A1 * | 7/2010 | Sung | G11C 11/5685 438/104 |
| 2012/0001146 A1 * | 1/2012 | Lu | G11C 11/5685 257/4 |
| 2015/0170760 A1 * | 6/2015 | Nardi | G11C 27/02 327/94 |
| 2015/0179509 A1 * | 6/2015 | Limdulpaiboon | H01L 21/76841 438/785 |
| 2016/0096920 A1 * | 4/2016 | Van Weerd | A61L 27/18 525/54.1 |

* cited by examiner

*Primary Examiner* — Caridad Everhart
(74) *Attorney, Agent, or Firm* — McClure, Qualey & Rodack, LLP

(57) ABSTRACT

A method for manufacturing a resistive memory device is disclosed and comprises following steps. Firstly, a bottom electrode is formed over a substrate. Next, an oxidation process is performed to the bottom electrode to form a metal oxide layer, wherein a hydrogen plasma and an oxygen plasma are provided during the oxidation process. Then, a top electrode is formed on the metal oxide layer.

17 Claims, 5 Drawing Sheets

METHOD FOR MANUFACTURING A RESISTIVE RANDOM ACCESS MEMORY DEVICE

BACKGROUND

Field of the Invention

The disclosure relates in general to a method for manufacturing a resistive random access memory device.

Description of the Related Art

Resistive random-access memory (ReRAM) is a type of a memory having a component called a memristor (contraction of "memory resistor"), whose resistance varies when different voltages are imposed across it. The ReRAM device works by changing the resistance of the memristor to store data.

Metal oxide ReRAM is a type of ReRAM working by varying the resistance in the metal oxide. It is necessary to form a metal oxide layer in the metal oxide ReRAM. Improvements of the method for forming the metal oxide layer are in highly demand for the quality and performance of the ReRAM.

SUMMARY

The disclosure relates to a method for manufacturing a resistive random access memory (ReRAM) device. The method for manufacturing the ReRAM device according to the embodiment provides improved controllability to the thickness of the metal oxide layer in the ReRAM device without suffering from a thermal budget issue.

According to the embodiment, a method for manufacturing a resistive memory device is disclosed and comprises following steps. Firstly, a bottom electrode may be formed over a substrate. Next, an oxidation process is performed to the bottom electrode to form a metal oxide layer, wherein a hydrogen plasma and an oxygen plasma are provided during the oxidation process. Then, a top electrode is formed on the metal oxide layer.

The disclosure will become apparent from the following detailed description of the preferred but non-limiting embodiments. The following description is made with reference to the accompanying drawings.

DETAILED DESCRIPTION

Figure 1:
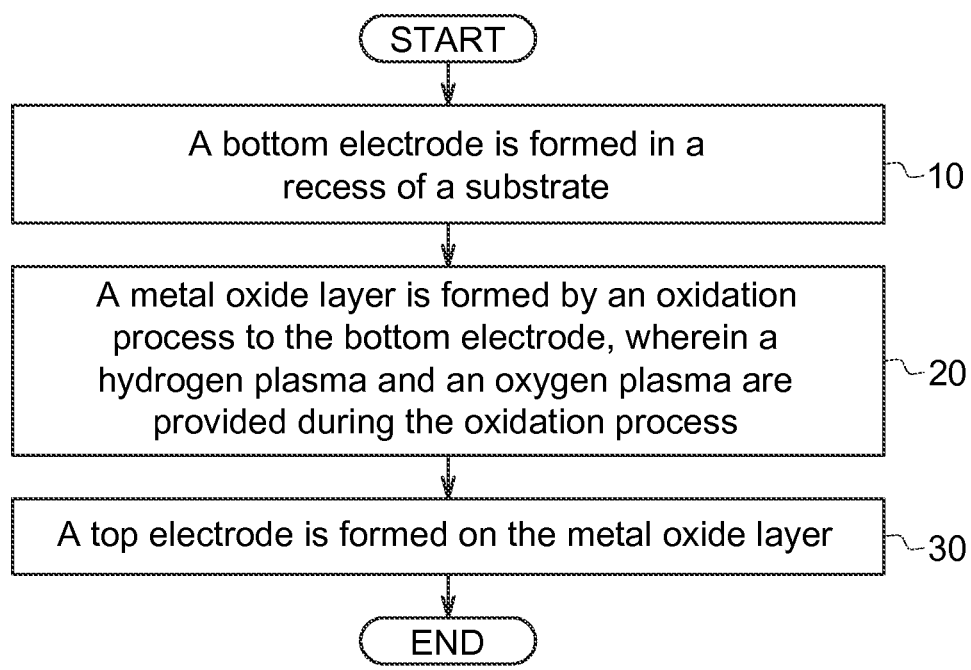
FIG. 1 is a flow chart illustrating a process for manufacturing a ReRAM device according to an embodiment of the present disclosure.

The embodiments of the present disclosure disclosed below are for elaborating a method for manufacturing a ReRAM device. The method for manufacturing the ReRAM device according to the embodiment provides improved controllability to the thickness of the metal oxide layer in the ReRAM device without suffering from a thermal budget issue. The present invention will now be described more specifically with reference to the following embodiments illustrating the method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIG. 1 is a flow chart illustrating a process for manufacturing a ReRAM device according to an embodiment of the present disclosure.

Referring to FIG. 1, a process of manufacturing a ReRAM device comprises the following steps. In step 10, a bottom electrode is formed in a recess of a substrate. In step 20, a metal oxide layer is formed by an oxidation process to the bottom electrode, wherein a hydrogen plasma and an oxygen plasma are provided during the oxidation process. In step 30, a top electrode is formed over the metal oxide layer.

Because the hydrogen plasma is provided during the oxidation process, the oxygen ions on the top surface of the bottom electrode can interact with the hydrogen ions, and the oxidation to the bottom electrode can be deeper. Therefore, the thickness of the metal oxide layer can be controlled by the ratio of the hydrogen plasma to the oxygen plasma, such as lager than 10 nm and less than 60 nm. The thickness of the metal oxide layer can be precisely and easily controlled by providing different ratios of the hydrogen plasma to the oxygen plasma.

FIG. 2A to FIG. 2H are cross-sectional views illustrating a method for manufacturing a ReRAM device according to an embodiment of the present disclosure.

Figure 2A:
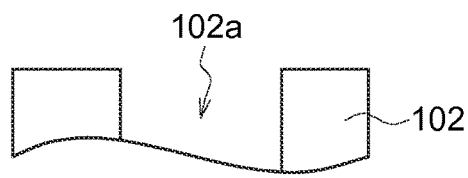
FIG. 2A to FIG. 2H are cross-sectional views illustrating a method for manufacturing a ReRAM device according to an embodiment of the present disclosure.

Referring to FIG. 2A, a substrate 102 having a recess 102a is provided. In some embodiments, the substrate 102 is formed of Si-containing oxide or other suitable material for the substrate.

Figure 2B:

Referring to FIG. 2B, a bottom electrode 104 is formed in the recess 102a. In some embodiments, the bottom electrode 104 can be formed by a deposition process, such as a low pressure chemical vapor deposition (LPCVD), or other suitable processes. The bottom electrode 104 can be selected from, for example, transition metals. The material of the bottom electrode 104 can be, for example, selected from TiN, W, Ru, Ta, Hf, Ni.

Figure 2C:
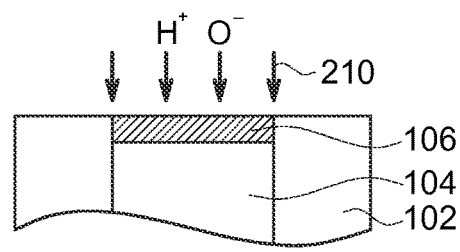

Referring to FIG. 2C, a metal oxide layer 106 then is formed by an oxidation process 210 to the bottom electrode 104, wherein a hydrogen plasma ($H^+$) and an oxygen plasma ($O^-$) are provided during the oxidation process 210. The top surface or the top area of the bottom electrode 104 is oxidized to form the metal oxide layer 106 by the oxidation process. A ratio ($H^+:O^-$) of the hydrogen plasma ($H^+$) to the oxygen plasma ($O^-$) can be larger than 0:1 and not more than 20:1.

In some embodiments, the oxidation process is implemented by a low temperature water plasma process (LTWPO). The oxidation process may be conducted in a temperature less than 300° C. Since the hydrogen plasma ($H^+$) is provided, the hydrogen ions can interact with the oxygen ions on the surface of the bottom electrode 104. Accordingly, more oxygen ions can diffuse deeper in the bottom electrode 104, and the thickness of the metal oxide layer 106 can be larger. Therefore, it is not necessary to conduct a high temperature, such as larger than 300° C., in the oxidation process to increase the reactivity. In this way, a thermal budget issue resulted from a high temperature oxidation process may be avoided.

In some embodiment, the hydrogen plasma and the oxygen plasma can be generated by a radio frequency voltage in the same chamber. In some embodiment, the hydrogen plasma and the oxygen plasma can be generated by a radio frequency (RF) power in different chambers. In some embodiment, the oxidation process and the generation of the hydrogen plasma and the oxygen plasma can be performed in the same chamber or in the different chambers.

In some embodiment, the hydrogen plasma and the oxygen plasma can be generated from $H_2O$, such as water or vapor. In this case, the ratio of the hydrogen plasma to the oxygen plasma can be 2:1. In some embodiment, the hydrogen plasma can be generated from $H_2$ or the combination of $H_2O$ and $H_2$. The oxygen plasma can be generated from $O_2$ or the combination of $H_2O$ and $O_2$.

The thickness of the metal oxide layer 106 is corresponding to the ratio of the hydrogen plasma to the oxygen plasma. In some embodiments, the metal oxide layer 106 can have a thickness larger than 10 nm. In some embodiments, the metal oxide layer 106 can have a thickness in a range of 10 nm to 60 nm. In some embodiments, the metal oxide layer 106 can have a thickness in a range of 40 nm to 50 nm. If a negative electrical potential in the bottom electrode 104 (or the metal oxide layer 106) produced by the oxygen ions (negatively charged) is too high, the amount of the oxygen ions in the plasma diffusing to the bottom electrode 104 (or the metal oxide layer 106) will be less. Since the hydrogen ions can be provided during the oxidation process, the negative electrical potential produced in the bottom electrode 104 can be reduced by the positively charged hydrogen ions. Owing to the reduction of the negative electrical potential in the bottom electrode 104, the amount of the oxygen ions in the plasma diffusing to the bottom electrode 104 (or the metal oxide layer 106) will be larger, and thereby more oxygen ions can diffuse deeper to the bottom electrode 104. Accordingly, the oxidation to the bottom electrode 104 can be deeper, and the depth of oxidation from the top surface of the bottom electrode 104 may not be too small, thus the thickness of the metal oxide layer 106 may not be too small. In this way, the thickness of the metal oxide layer 106 can be precisely and easily controlled by providing different ratios of the hydrogen plasma to the oxygen plasma.

Figure 2D:
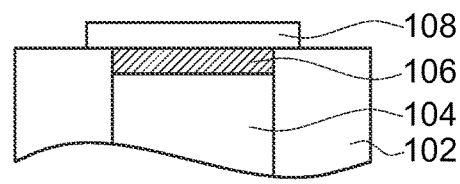

Referring to FIG. 2D, a top electrode 108 is formed on the metal oxide layer 106. The top electrode 108 can cover the metal oxide layer 106 and a portion of the substrate 102. In some embodiment, the top electrode 108 can be formed of the metal. In some embodiment, the top electrode 108 can be selected from TiN, Ti, Al, Ir, Pt, and Ni.

Figure 2E:
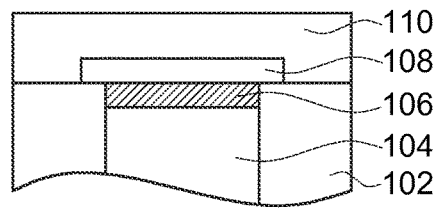

Referring to FIG. 2E, an isolation layer 110 is formed on the top electrode 108. The isolation layer 110 can be formed of oxide or nitride materials, such as silicon nitride or silicon oxide.

Figure 2F:
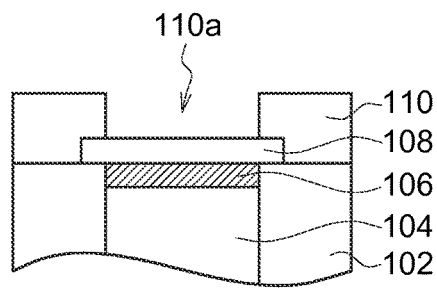

Referring to FIG. 2F, a via 110a may be formed in the isolation layer 110 to expose the top electrode 108. The via 110a may be formed by an etching process.

Figure 2G:
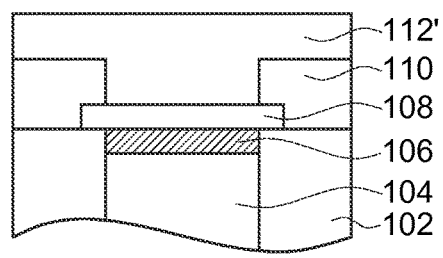

Referring to FIG. 2G, a metal layer 112' may be formed on the isolation layer 110. The metal layer 112' may cover the top electrode layer 108 and the isolation layer 110.

Figure 2H:
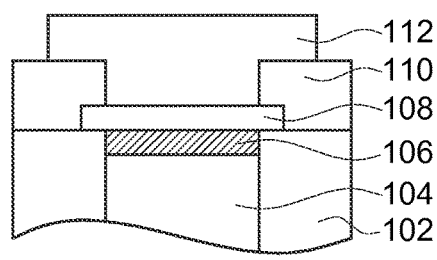

Referring to FIG. 2H, the metal layer 112' is patterned to form a connection 112. The connection 112 may be formed on the isolation layer 110, and cover the top electrode layer 108 and part of the isolation layer 110. The connection 112 may be electrically connected to the bottom electrode 104 through the via 110a.

Figure 3:
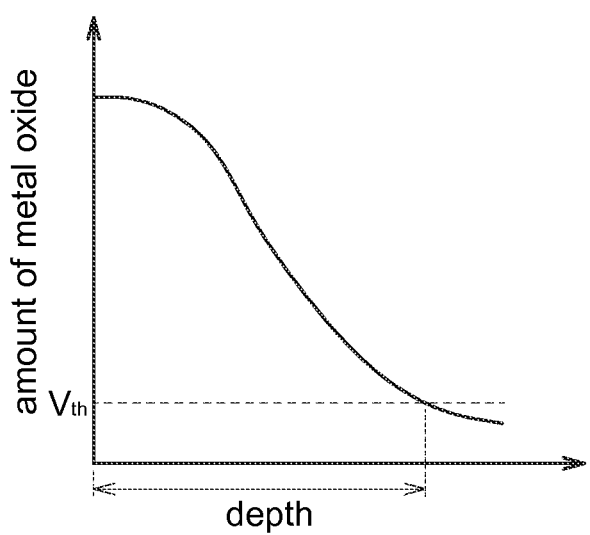
FIG. 3 shows the relation between the amount of the metal oxide and the depth of the oxidation for a ReRAM device according to an embodiment of the present disclosure.

FIG. 3 shows the relation between the amount of the metal oxide and the depth of the oxidation for a ReRAM device according to an embodiment of the present disclosure.

Referring to FIG. 3, since the depth of the oxidation to the bottom electrode 104 corresponds to the ratio of the hydrogen plasma to the oxygen plasma, the amount of the metal oxide formed from the top surface of the bottom electrode 104 can be controlled and the depth of the metal oxide layer 106 is controllable. For a critical value Vth, the amount of the oxide formed from the top surface of the bottom electrode 104 is corresponding to the depth of the metal oxide layer 106.

Figure 4A:
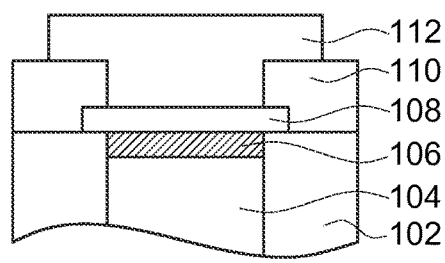
FIG. 4A to FIG. 4C are cross-sectional views illustrating an operating mechanism in a ReRAM device according to an embodiment of the present disclosure.
Figure 4B:
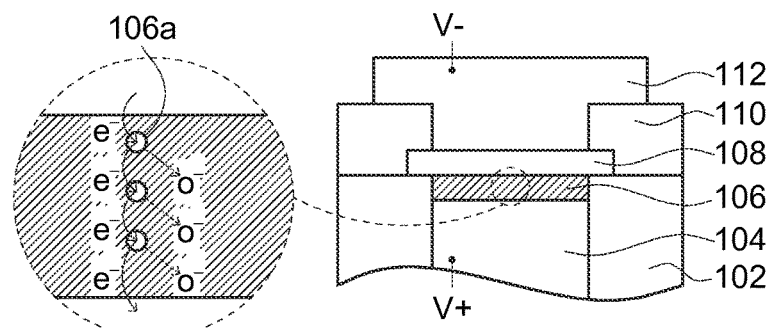
Figure 4C:
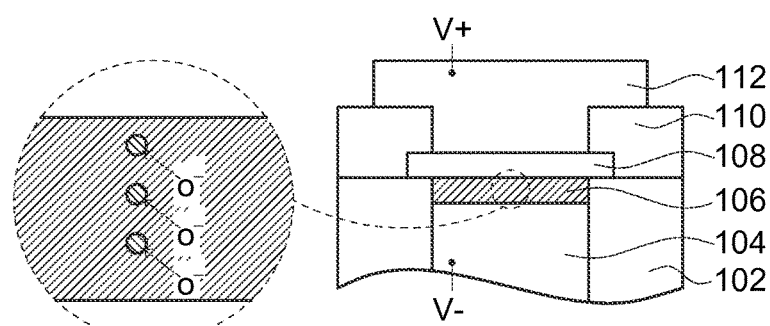

FIG. 4A to FIG. 4C are cross-sectional views illustrating an operating mechanism in a ReRAM device according to an embodiment of the present disclosure.

Referring to FIG. 4A, when no voltage is applied to the bottom electrode 104 and the top electrode 108, a stable metal-oxygen bonding, such as one tungsten atom bonding with three oxygen atoms ($WO_3$), can exist in the metal oxide layer 106. In this case, the metal oxide layer 106 is in a high resistance.

Referring to FIG. 4B, when a negative voltage V− is applied to the connection 112 and the top electrode 108 and a positive voltage V+ is applied to the bottom electrode 104, an unstable metal-oxygen bonding, such as $WO_{3-X}$, can exist in the metal oxide layer 106. In this case, the metal oxide layer 106 has low resistance. That is, some oxygen ions in the metal oxide layer 106 may be removed to form some oxygen vacancies. Thus, some defects 106a may be formed in the metal oxide layer 106, and electrons may be transmitted through the defects 106a from the top electrode 108 to the bottom electrode 104.

Referring to FIG. 4C, when a positive voltage V+ is applied to the connection 112 and the top electrode 108 and a negative voltage V− is applied to the bottom electrode 104, the oxygen ions may be moved back to the oxygen vacancies, so the defects 106a may be disappeared. Thus, a stable metal-oxygen bonding, such as one tungsten atom bonding with three oxygen atoms (WO3), can exist in the metal oxide layer 106 again. In this case, the metal oxide layer 106 has high resistance.

By performing the metal oxide layer 106 in a high resistance state and a low resistance state, the data for logic 1 and the data for logic 0 can be stored in the ReRAM device.

In a comparative example, a Rapid Thermal Oxidation (RTO) process is used to form a metal oxide layer in a ReRAM device. By performing the RTO process in a temperature lager than 300° C., the entire area of the bottom electrode subjected to this high temperature can be oxidized. That is, a depth of the oxidation from a top surface of the bottom electrode may be larger than 60 nm, and the metal oxide layer can be formed in a thickness larger than 60 nm. By using the RTO process, the thickness of the metal oxide layer can be controlled according to oxidation time and temperature, however, the thickness of the metal oxide layer is generally more than 60 nm, and is hard to be precisely controlled. For some special application in ReRAM device, the thickness of the metal oxide layer is preferably less than 60 nm. The RTO process may not suitable to form the metal oxide layer having a thickness less than 60 nm. In addition, the high temperature during the process may result in the increase of the thermal budget.

In another comparative example, an Oxygen Plasma Oxidation (OPO) process is used to form a metal oxide layer in a ReRAM device. By performing the OPO process, a top surface of a bottom electrode can be oxidized by a pure oxygen plasma. However, the top surface of the bottom electrode may be easily full of the oxygen ions, so the depth of the oxidation from the top surface of the bottom electrode may be smaller, such as 3-5 nm, and the thickness of the metal oxide layer is generally in a range of 3-5 nm. For some special application in ReRAM device, the thickness of the metal oxide layer is preferably larger than 10 nm. The OPO process may not suitable to form the metal oxide layer having a thickness larger than 10 nm.

In the present invention, by applying the oxidation process to the bottom electrode, a top surface of the bottom electrode can be directly oxidized to form the metal oxide layer. Other types of processes, such as deposition process or etching process, to form a metal oxide layer covering the bottom electrode are not necessary, so the cost can be lowered down. Besides, the oxidation process can be conducted in a low temperature (less than 300° C.), so the thermal budget can be reduced. Because the hydrogen plasma is provided during the oxidation process, the oxygen ions on the top surface of the bottom electrode can interact with the hydrogen ions, and the oxidation to the bottom electrode can be deeper. Therefore, the thickness of the metal oxide layer may be controlled according to the ratio of the hydrogen plasma to the oxygen plasma, such as lager than 10 nm and less than 60 nm. The thickness of the metal oxide layer can be precisely and easily controlled by providing different ratios of the hydrogen plasma to the oxygen plasma.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a resistive random access memory (ReRAM) device, comprising:
   forming a bottom electrode over a substrate;
   performing an oxidation process to the bottom electrode to form a metal oxide layer, wherein a hydrogen plasma and an oxygen plasma are provided during the oxidation process; and
   forming a top electrode on the metal oxide layer;
   wherein the oxidation process is conducted in a temperature less than 300° C.,
   wherein a ratio of the hydrogen plasma to the oxygen plasma is larger than 0:1 and not more than 20:1.

2. The method according to claim 1, wherein the substrate has a recess, and the bottom electrode is formed in the recess.

3. The method according to claim 1, wherein the bottom electrode is selected from a transition metal.

4. The method according to claim 1, wherein the material of the bottom electrode is selected from the group consisting of TiN, W, Ru, Ta, Hf, Ni, and the combination thereof.

5. The method according to claim 1, wherein the material of the top electrode is selected from the group consisting of TiN, Ti, Al, Ir, Pt, Ni, and the combination thereof.

6. The method according to claim 1, wherein the hydrogen plasma and the oxygen plasma are generated from $H_2O$.

7. The method according to claim 1, wherein the hydrogen plasma is generated from $H_2$ or the combination of $H_2O$ and $H_2$.

8. The method according to claim 1, wherein the oxygen plasma is generated from $O_2$ or the combination of $H_2O$ and $O_2$.

9. The method according to claim 1, wherein the ratio of the hydrogen plasma to the oxygen plasma is larger than 0:1 and not more than 2:1.

10. The method according to claim 1, wherein a thickness of the metal oxide layer is corresponding to the ratio of the hydrogen plasma to the oxygen plasma.

11. The method according to claim 1, wherein the metal oxide layer has a thickness larger than 10 nm.

12. The method according to claim 1, wherein the metal oxide layer has a thickness in a range of 10 nm to 60 nm.

13. The method according to claim 1, further comprising:
    forming an isolation layer on the top electrode;
    forming a via in the isolation layer to expose the top electrode; and
    forming a connection on the isolation layer, wherein the connection is electrically connected to the bottom electrode through the via.

14. A method for manufacturing a ReRAM device, comprising:
    forming a bottom electrode over a substrate;
    performing an oxidation process to the bottom electrode to form a metal oxide layer having a thickness larger than 10 nm, wherein a hydrogen plasma and an oxygen plasma are provided during the oxidation process and the oxidation process is conducted in a temperature less than 300° C.; and
    forming a top electrode on the metal oxide layer,
    wherein a ratio of the hydrogen plasma to the oxygen plasma is larger than 0:1 and not more than 20:1.

15. The method according to claim 14, wherein the bottom electrode is selected from a transition metal.

16. The method according to claim 14, wherein the hydrogen plasma and the oxygen plasma are generated from $H_2O$.

17. The method according to claim 14, wherein the hydrogen plasma is generated from $H_2$ or the combination of $H_2O$ and $H_2$.

* * * * *